(12) United States Patent
Roig-Guitart et al.

(10) Patent No.: US 12,640,727 B2
(45) Date of Patent: May 26, 2026

(54) ASYMMETRIC COMMON SOURCE INDUCTANCES TO REDUCE TURN-OFF OVERVOLTAGE IN MOSFETS

(71) Applicant: SEMICONDUCTOR COMPONENTS INDUSTRIES, LLC, Scottsdale, AZ (US)

(72) Inventors: Jaume Roig-Guitart, Oudenaarde (BE); Alexis Anselmo Gomez, Caranceja (ES); Juan Ramon Garcia-Mere, Gijon (ES)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 17 days.

(21) Appl. No.: 18/636,445

(22) Filed: Apr. 16, 2024

(65) Prior Publication Data

US 2025/0323639 A1 Oct. 16, 2025

(51) Int. Cl.
*H03K 17/082* (2006.01)
*H10D 30/65* (2025.01)
(Continued)

(52) U.S. Cl.
CPC ......... *H03K 17/0822* (2013.01); *H10D 30/65* (2025.01); *H10D 30/66* (2025.01); *H10D 62/8325* (2025.01); *H10D 84/83* (2025.01)

(58) Field of Classification Search
CPC .... H03K 17/0822; H10D 30/65; H10D 30/66; H10D 62/8325; H10D 84/83
See application file for complete search history.

(56) References Cited

U.S. PATENT DOCUMENTS 4,609,904 A * 9/1986 Paine ....................... B60Q 5/00
200/61.54
11,522,545 B1* 12/2022 Dunn ................... H10D 84/151
(Continued)

FOREIGN PATENT DOCUMENTS

JP H01298949 A 12/1989
WO 2023174613 A1 9/2023
WO WO2023/174613 * 9/2023

OTHER PUBLICATIONS

Zojer, Bernhard, "A new gate drive technique for superjunction MOSFETs to compensate the effects of common source inductance." 2018 IEEE Applied Power Electronics Conference and Exposition (APEC), pp. 2763-2768.
(Continued)

*Primary Examiner* — Sibin Chen
(74) *Attorney, Agent, or Firm* — Brake Hughes Bellermann LLP

(57) ABSTRACT

A circuit includes a metal-oxide semiconductor field-effect transistor (MOSFET) having a gate, a source, and a drain. The circuit further includes a first inductor and a second inductor. The first inductor has a small inductance value that is less than a larger inductance value of the second inductor. The circuit further includes a switch configured to include the first inductor in a current path shared by a gate loop and a source loop of the MOSFET when the MOSFET is turning on, and to include the second inductor in the current path shared by the gate loop and the source loop when the MOSFET is turning off.

17 Claims, 14 Drawing Sheets

200

(51) Int. Cl.
   *H10D 30/66*        (2025.01)
   *H10D 62/832*      (2025.01)
   *H10D 84/83*        (2025.01)

(56)                    References Cited

U.S. PATENT DOCUMENTS

| | | | | |
|---|---|---|---|---|
| 2006/0158160 A1* | 7/2006 | Friedrich | ............. | H02M 3/156 |
| | | | | 323/222 |
| 2009/0243715 A1 | 10/2009 | Havanur | | |
| 2012/0256493 A1* | 10/2012 | Saito | ................... | H03K 17/168 |
| | | | | 307/98 |
| 2017/0098634 A1* | 4/2017 | Kumar | ................... | H01L 25/50 |
| 2018/0131365 A1 | 5/2018 | Zojer | | |
| 2021/0036696 A1 | 2/2021 | Pham et al. | | |
| 2022/0216795 A1 | 7/2022 | Yanagi et al. | | |
| 2023/0126070 A1 | 4/2023 | Oberdieck et al. | | |

OTHER PUBLICATIONS

Chen, Zheng, et al., "Optimal DC-Link RC Snubber Design for SiC MOSFET Applications", IEEE Energy Conversion Congress and Exposition (ECCE), Sep. 2019, pp. 1974-1980.

Liang, M. et al., "Research on an improved DC-side snubber for suppressing the turn-off overvoltage and oscillation in high speed SiC MOSFET application", In 2017 IEEE Energy Conversion Congress and Exposition (ECCE), pp. 1358-1365.

International Search Report and Written Opinion for PCT Application No. PCT/US2024/039440, mailed on Jan. 21, 2025, 16 pages.

Cacciato, et al., "High Frequency Operation of Superjunction MOSFET Enhanced With Kelvin Source Pin", 2020 AEIT, 2020, 6 pages.

* cited by examiner

200

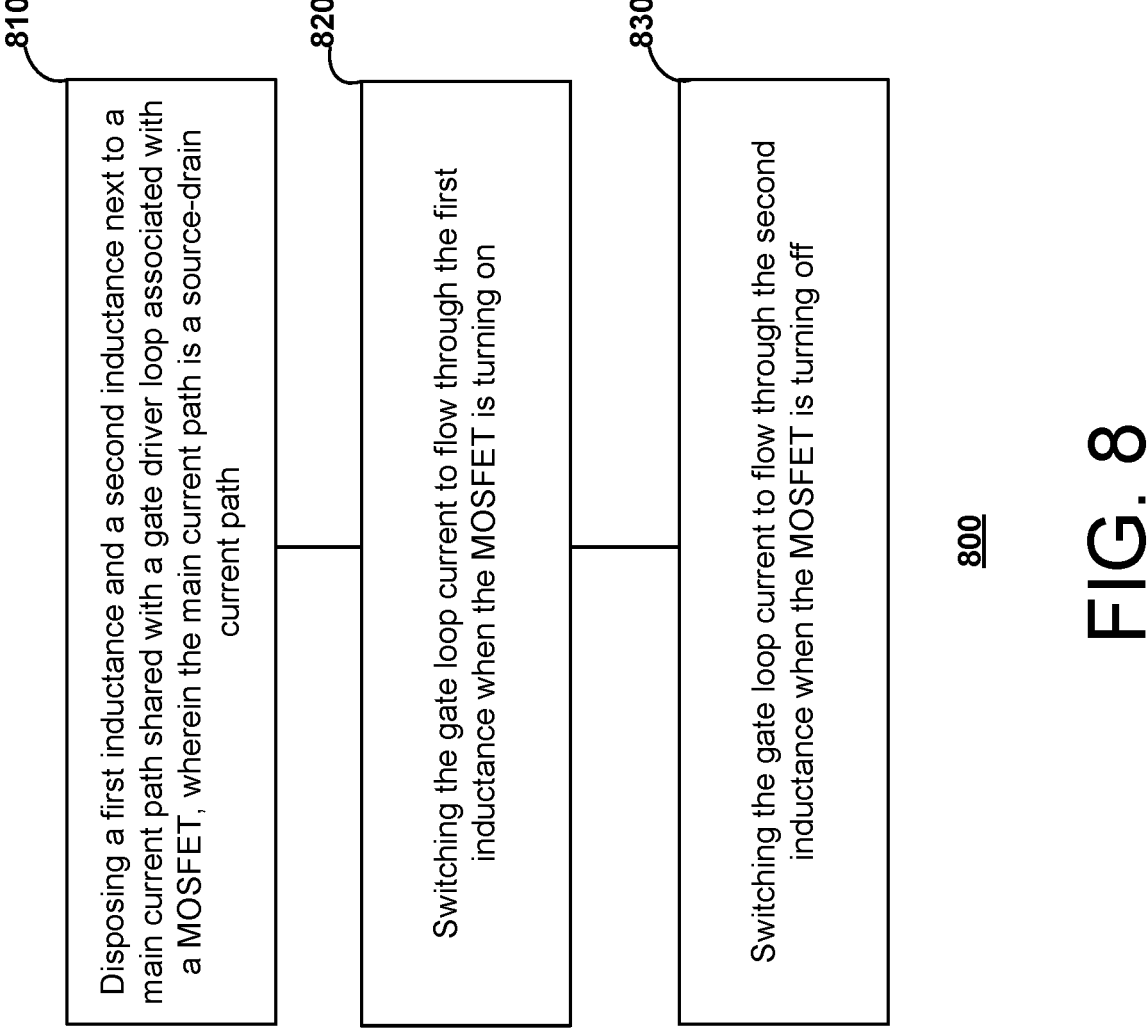

810

Disposing a first inductance and a second inductance next to a main current path shared with a gate driver loop associated with a MOSFET, wherein the main current path is a source-drain current path

820

Switching the gate loop current to flow through the first inductance when the MOSFET is turning on

830

Switching the gate loop current to flow through the second inductance when the MOSFET is turning off

ASYMMETRIC COMMON SOURCE INDUCTANCES TO REDUCE TURN-OFF OVERVOLTAGE IN MOSFETS

TECHNICAL FIELD

This description relates to semiconductor devices and, more particularly, to transistor devices, such as metal-oxide semiconductor field-effect transistors.

BACKGROUND

Power transistors (e.g., metal-oxide semiconductor field effect transistors (MOSFETs)) are used in all kinds of consumer, automotive and industrial electronic systems Representative examples of applications in which these devices can be found include the inverters used for power conversion in renewable energy systems and the power topologies used in the powertrains for electrical vehicles. These applications can involve known converter topologies or transistor configurations such as a resonant inverter, a full-bridge, a half-bridge, an asymmetrical half-bridge, etc. Each of these different transistor configurations present one or several networks made up of a high-side (HS) switch and a low-side (LS) switch that operate complementarily and couple to a common switching node. These switches can either be transistors (if the switch is driven by means of a control voltage) or diodes (if the switch is not driven by a control voltage). Parasitic inductances associated with the HS and LS switches and/or in a printed circuit board (PCB) used to implement a power converter, combined with an output capacitance ($C_{oss}$) of the LS transistor can cause overshoot and/or ringing at the switch node (e.g., of a drain-to-source Voltage ($V_{DS}$) or Current ($I_D$)). Such overshoot and/or ringing can cause a voltage on the switch node to exceed a breakdown voltage of the LS transistor, such as a drain-to-source breakdown voltage ($BV_{dss}$) of a LS MOSFET. When $BV_{dss}$ is exceeded, a power conversion efficiency of the power converter can be reduced and/or the transistor can be damaged or destroyed.

SUMMARY

In a general aspect, a circuit includes a metal-oxide semiconductor field-effect transistor (MOSFET) having a gate, a source, and a drain. The circuit further includes a first inductor, a second inductor and a switch. The first inductor has a small inductance value that is less than a larger inductance value of the second inductor. The switch is configured to include the first inductor in a current path shared by a gate loop and a source loop of the MOSFET when the MOSFET is turning on, and to include the second inductor in the current path shared by the gate loop and the source loop when the MOSFET is turning off.

In a general aspect, a circuit includes a metal-oxide semiconductor field-effect transistor (MOSFET) having a gate, a source, and a drain. The circuit further includes a first inductor, a second inductor, a switch, and a current-limiting element disposed in series in a source-drain current path and shared with a gate driver loop of the MOSFET. The switch is configured to close and short the second inductor and the current-limiting element such that a gate loop current flows through the first inductor and bypasses the second inductor and the current-limiting element when the MOSFET is turning on.

In a general aspect, a method includes disposing a first inductor and a second inductor next to a source-drain current path shared with a gate driver loop associated with a MOSFET. The method further includes switching a gate loop current to flow through the first inductor when the MOSFET is turning on; and switching the gate loop current to flow through the second inductor when the MOSFET is turning off.

BRIEF DESCRIPTION OF THE DRAWINGS

FIG. 8 is a flow chart illustrating an example method for reducing turn-off overvoltage and switching power loss (e.g., turn-off power loss, Eoff) in a power MOSFET.

DETAILED DESCRIPTION

Figure 1:
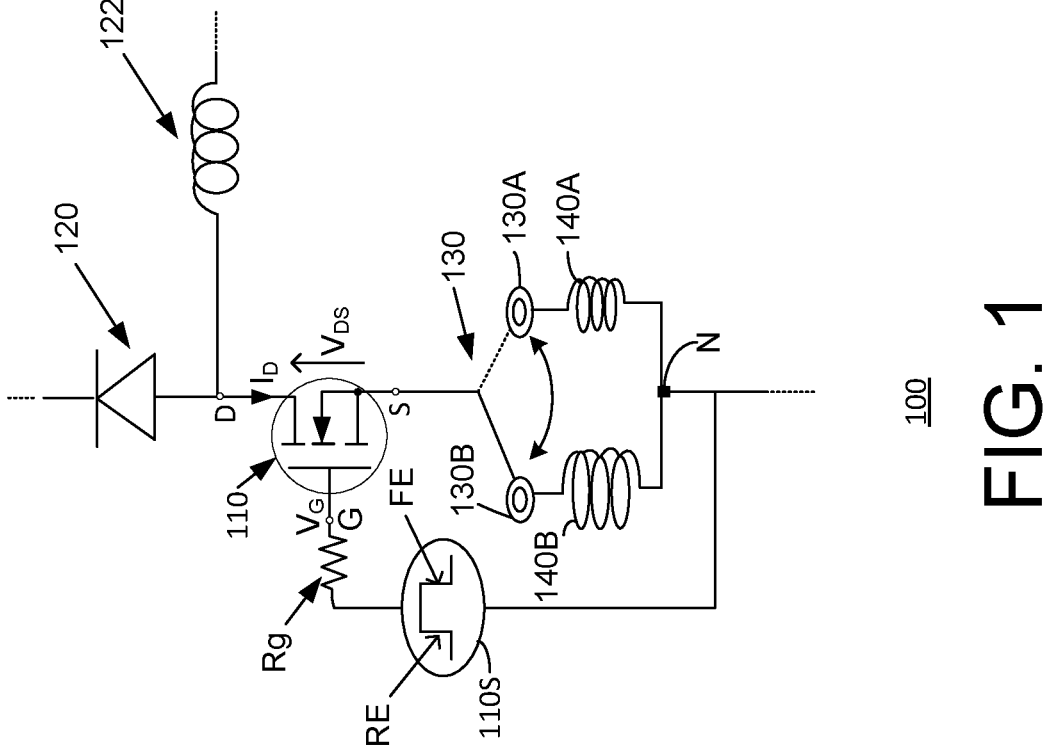
FIG. 1 is a block diagram schematically illustrating a SiC MOSFET driver circuit in which a common source inductance (Lcs) can be switched between a smaller value inductance in a turn-on state of the MOSFET and a larger value inductance in a turn-off state of the MOSFET.

This disclosure is directed to circuits and devices, for example, semiconductor devices, that can be implemented in a power converter, such as direct-current to direct-current (DC-DC) power converter, a power factor correction (PFC) boost converter, or a 3-phase inverter.

A silicon carbide (SiC) MOSFET can be rated for applications at high voltages that may, for example, exceed 600 volts. Common source inductance (CSI or common source inductance (Lcs)) is the inductance shared by a main current path and a gate driver loop in the MOSFET. The drain-source current and the gate-charging current of the MOSFET are both carried by the Lcs. The Lcs described herein need not be formed of discreet or lumped inductor elements but can be formed by distributed or parasitic inductive elements. The Lcs can be a function of device packaging (materials and layout) and a function of device layout.

For a small Lcs, the SiC MOSFET can have a faster turn-off with a large turn-off $V_{DS}$ overvoltage and a correspondingly large switching power loss (e.g., turn-off power loss, Eoff). Further, a SiC MOSFET with a Kelvin connection (with a small Lcs) can reach avalanche conditions in the hard-switching based circuit topologies used for the power converter circuits. Furthermore, a SiC power MOSFET can show a small short-circuit wait time (SCWT) when being tested with sequential time increase compared to a single event-to-failure test because of the large turn-off $V_{DS}$ overvoltage that may be associated with the SiC MOSFET.

An approach to reduce both turn-off $V_{DS}$ overvoltage ( ) and the turn-off power loss (Eoff) can be implemented in a Si super junction (SJ) MOSFET by reducing the Lcs of the MOSFET. The reduced Lcs approach works in the Si super junction (SJ) MOSFET, for example, to reduce overshoot and/or ringing on a switch node (e.g., in an associated power converter) while also reducing power conversion efficiency losses. The approach of reducing Lcs for turn-on and turn-off of a Si SJ MOSFET may not work as efficiently for a SiC MOSFET because the output charge $Q_{oss}$ (drain-source charge) of the SiC MOSFET can be several times (e.g., 4 to 5 times) smaller than that of the Si SJ MOSFET while the gate charge $Q_G$ of the SiC MOSFET is about the same as that of the Si SJ MOSFET.

In example implementations, an asymmetric common source inductance (Lcs) scheme is implemented for turn-on and turn-off of a SiC MOSFET, in accordance with the principles of the present disclosure.

In example implementations, a driver circuit associated with the SiC MOSFET may include inductive elements that have different inductance values (Lcs) that can be interchangeably introduced in the gate-source loops of the SiC MOSFET. The gate current ($I_G$) will flow through this loop to charge and discharge the SiC MOSFET parasitic capacitances during the turn-on and turn-off transients. The inductive elements may, for example, include a first inductive element having a smaller Lcs value and a second inductive element having a larger Lcs value. The first inductive element having the smaller Lcs value and a second inductive element having the larger Lcs value may be disposed in branching $I_G$ current paths. In example implementations, the driver circuit may include a switch that, for example, may introduce the first inductive element having a small Lcs value in the gate-source loop of the SiC MOSFET when the MOSFET is in a turn-on state, and introduce the second inductive element having a larger Lcs value in the gate-source loop of the SiC MOSFET when the MOSFET is in a turn-off state.

It should be noted that a MOSFET is a voltage-controlled device and that the gate referred to herein is the current required, for example, to charge and discharge parasitic capacitances during the turn-on and turn-off transients of the MOSFET.

FIG. 1 is a circuit diagram schematically illustrating portions of a driver circuit 100 in which a common source inductance (Lcs) in the source-drain current ($I_D$) current path can be switched between a smaller value inductance in a turn-on state of a SiC MOSFET 110 and a larger value inductance in a turn-off state of the MOSFET.

As shown in FIG. 1, a SiC MOSFET 110 may have a gate G, a drain D, and a source S. In example implementations, SiC MOSFET 110 may be an N-channel power MOSFET.

As shown in FIG. 1, drain D may be coupled to an output load represented by a diode 120 and an output inductance (L) 122. A gate signal 101S (e.g., a rectangular or square pulse) can be applied to gate G across a gate resistance Rg to switch SiC MOSFET 110 between an on state and an off state. A drain-to-source voltage $V_{DS}$ is transmitted (applied) to the output load by SiC MOSFET 110. The drain-to-source voltage $V_{DS}$ may correspond to a source-drain current $I_D$ flowing between drain D and source S.

Gate signal 101S may have a rising edge RE which can turn on MOSFET 110 and a falling FE edge which can turn off MOSFET 110.

In example implementations, driver circuit 100 may include a switch 130 (other than SiC MOSFET 110 itself). Switch 130 may be configured to introduce asymmetric inductance values (Lcs) in the gate-source loop of the SiC MOSFET. In example implementations, switch 130 may be closed, for example, in either a first position 130A or in a second position 130B. A smaller value inductance (e.g., inductor 140A) may be disposed between the first position 130A and a node point N. Node point N in this case may refer to a reference terminal of the gate driver. Further, a larger value inductance (e.g., inductor 140B) may be disposed between the second position 130B and the node point N.

First position 130A and second position 130B may respectively correspond to the turn-on state and the turn-off state of SiC MOSFET 110. In the turn-on state of SiC MOSFET 110, switch 130 may be closed in first position 130A to introduce the smaller value inductance (e.g., inductor 140A) in the gate-source loop of the SiC MOSFET 110. In the turn-off state of SiC MOSFET 110, switch 130 may be closed in second position 130B to introduce the larger value inductance (e.g., inductor 140B) in the gate-source loop of the SiC MOSFET 110.

In example implementations, for an example 650 volts SiC power MOSFET, the smaller value inductance (e.g., inductor 140A) may, for example, be smaller than 0.5 nH, and the larger value inductance (e.g., inductor 140B) may, for example, be greater than 3.0 nH.

In example implementations, for an example 650 volts SiC power MOSFET, the smaller value inductance (e.g., inductor 140A) may, for example, be about 1.0 nH or less (e.g., less than 0.5 nH), and the larger value inductance (e.g., inductor 140B) may, for example, be in a range or 2.0 nH to 10.0 nH (e.g., greater than 3.0 nH).

The asymmetry in the values of inductance introduced in the gate-source loop of can reduce turn-off overvoltage without penalizing the switching power loss (e.g., turn-off power loss, Eoff) of SiC MOSFET 110.

In some example implementations, a low voltage auxiliary switch and a current-limiting element (e.g., a resistor) can be used to implement the asymmetric small/large Lcs scheme during turn-on/turn-off of the SiC MOSFET.

Figure 2:
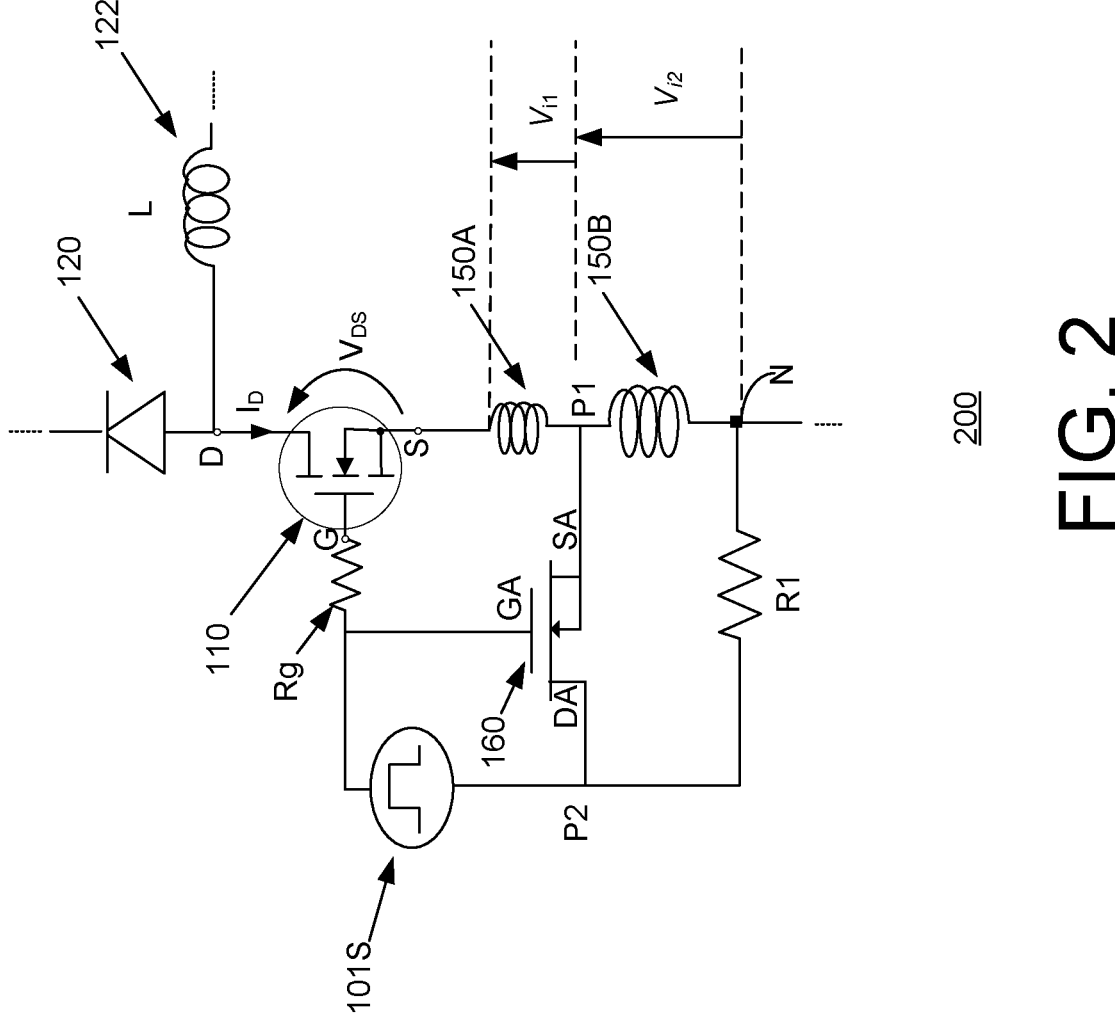
FIG. 2 is a circuit diagram schematically illustrating portions of a driver circuit in which a low voltage auxiliary switch and a resistor are used to implement the asymmetric small/large Lcs scheme for a SiC MOSFET.

FIG. 2 shows a circuit diagram schematically illustrating portions of a driver circuit 200 in which a low voltage auxiliary switch and a current-limiting element (e.g., a resistor) are used to implement the asymmetric small/large Lcs scheme for SiC MOSFET 110.

In driver circuit 200, a smaller value inductance (e.g., inductor 150A) and a larger value inductance (e.g., inductor 150B) are formed in series between the source S of the MOSFET 110 and a node N in the main current path. A low voltage auxiliary switch 160 can short out or bypass the larger value inductance (e.g., inductor 150B) in the source-drain current $I_D$ path that is common to the gate loop and the power loop when auxiliary switch 160 is activated. In example implementations, auxiliary switch 160 can be a MOSFET with a source SA, a drain DA, and a gate GA. A resistor R1 extending from node N in the main current path is disposed parallel to auxiliary switch 160. As shown in FIG. 2, source SA of auxiliary switch 160 may be connected to a tap point P1 between the smaller value inductance (e.g., inductor 150A) and the larger value inductance (e.g., inductor 150B). Drain DA of auxiliary switch 160 is connected to a tap point P2 between resistor R1 and gate resistance Rg. A first gate current ($I_G$) return path or auxiliary branch (e.g., first return path RT1, FIG. 7) in the driver circuit 200 extends from tap point P1 to tap point P2 through auxiliary switch 160. A current on the first gate current ($I_G$) return path or auxiliary branch passes through the smaller value inductance (e.g., inductor 150A) but bypasses the larger value inductance (e.g., inductor 150B). A second gate current ($I_G$) return path or auxiliary branch (e.g., second return path RT2, FIG. 7) in the driver circuit 200 extends from a node N to tap point P2 through resistor R1. A current on the second return path or auxiliary branch passes through both the smaller value inductance (e.g., inductor 150A) and the larger value inductance (e.g., inductor 150B). In other words, the switch is configured to open when the MOSFET is turning off to introduce the second inductor in the source-drain current path.

A different Lcs (e.g., Lcs=inductor 150A or Lcs=(inductor 150A+inductor 150B)) is shared between the gate and power loops depending on which driver return path is activated. If the driver return path is at tap point P1, then the voltage drop created by d(Id)/dt in Lcs (inductor 150A) is small. If the driver return path is at node N, then the voltage drop created by d($I_D$)dt in Lcs (inductor 150Bb) is large. A voltage drop in Lcs has an opposite effect to the gate-source voltage (Vgs) (e.g., driver signal 101S) applied to SiC MOSFET 110 by the driver. This leads to the transient responses of the MOSFET to changes in Vgs being dampened or slowed down.

In example implementations, the gate-source voltage (Vgs) applied to the gate G of SiC MOSFET 110 is counteracted by a voltage $V_{i1}$ (e.g., induced voltage $V_i$=L*di/dt) on a small value inductance in the first driver return path when turning on the SiC MOSFET, and the gate-source voltage (Vgs) applied to the gate G of SiC MOSFET 110 counteracted by a voltage $V_{i2}$ (e.g., induced voltage $V_{i2}$=Lcs (inductor 150A+inductor 150B)*d$I_D$/dt) on a large value inductance when turning off the SiC MOSFET 110.

In the configuration shown in FIG. 2, driver signal 101S that is applied to gate G of SiC MOSFET 110 across gate resistance Rg to switch SiC MOSFET 110 on or off is also applied to gate GA of auxiliary switch 160 to turn the auxiliary switch on or off. Auxiliary switch 160 may be turned-on during the turning-on of SiC MOSFET 110 and may be turned-off during the turning-off of SiC MOSFET 110.

In example implementations, resistor R1 may be substantially larger than an on-resistance (Ron) of auxiliary switch 160. When auxiliary switch 160 is turned on, the gate current $I_G$ provided by the gate driver will flow over the first return path from tap point P1 to tap point P2 through the auxiliary switch during the turn-on transient, and drain-source current $I_D$ will flow only through inductor 150A. Only the smaller value inductance of inductor 150A is shared between the gate loop and power loop. The larger value inductance of inductor 150B and resistor R1 are shorted out or bypassed.

In example implementations, resistor R1 may be substantially smaller than an off-resistance (Roff) of auxiliary switch 160. When auxiliary switch 160 is turned off, the gate current $I_G$ will flow over the second return path from node N to tap point P2 through resistor R1, and drain-source current will flow through both inductors 150A and 150B. The smaller value inductance of inductor 150A in series with the larger value inductance of inductor 150B is common to the gate and power loops.

In example implementations, for an example SiC MOSFET 110 (e.g., a MOSFET rated for operation at 650V), the smaller value inductance of inductor 150A may, for example, be 0.3 nH or less and the larger value inductance of inductor 150A may, for example, be 1 nH or greater.

Figure 3:
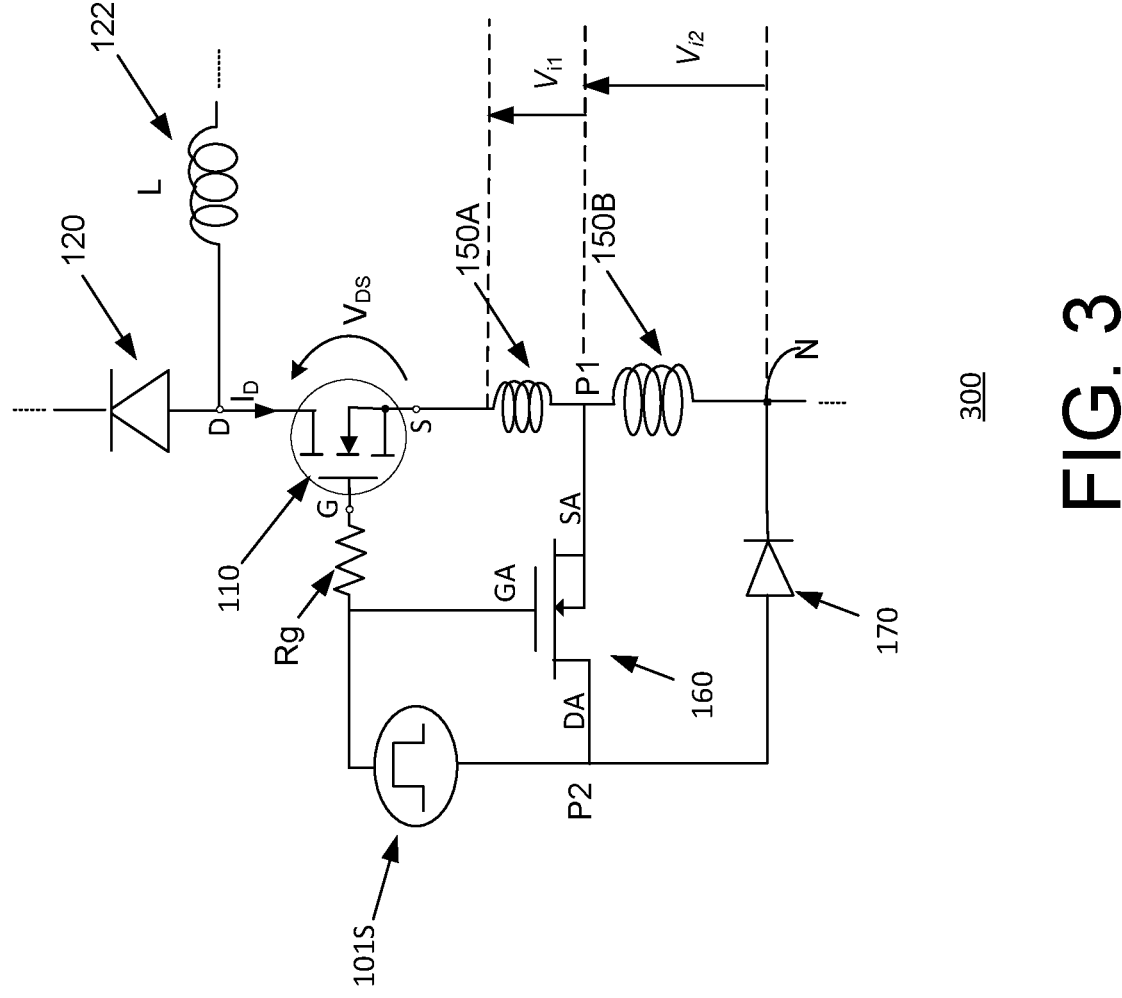
FIG. 3 illustrates an example circuit in which a resistor R1 in the circuit of FIG. 2 is replaced by a diode.

In some implementations, resistor R1 may be replaced by a diode 170 to block current flow through larger value inductance (e.g., inductor 150A). FIG. 3 shows an example circuit 300 in which resistor R1 (FIG. 2) is replaced by a diode 170. Using low voltage auxiliary switch 160 in conjunction with diode 170 to implement the asymmetric small/large Lcs scheme may prevent current circulating in reverse through the auxiliary device.

In some implementations, resistor R1 may be replaced another low voltage auxiliary switch MOSFET (not shown) to block current flow through larger value inductance (e.g., inductor 150A). In some implementations, auxiliary switch 160 may be replaced a diode (not shown) to block current flow returns over the first return path.

In example implementations, the foregoing circuit arrangements (e.g., circuit 200, FIG. 2, circuit 300, FIG. 3) may be fabricated using components mounted on a printed circuit board (PCB). The components may, for example, include surface mounted packages or surface mounted devices (SMD).

Figure 4B:
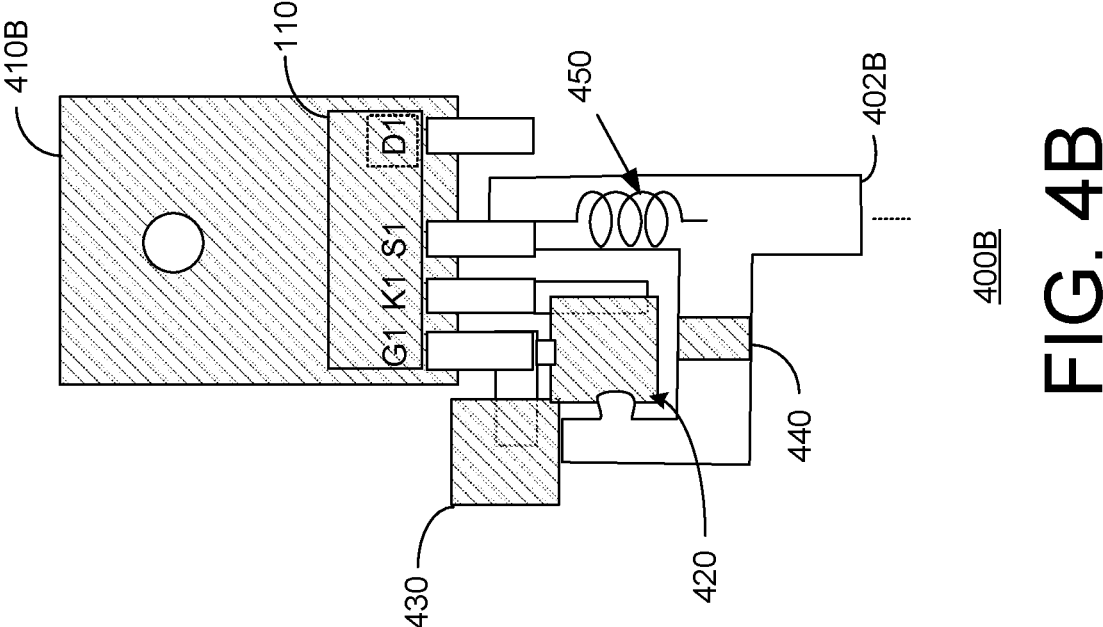
FIG. 4B shows a plan view of an example circuit fabricated on a printed circuit board (PCB) with discrete components, including a power transistor assembled on the PCB in a Through-Hole mounting (THM) technology.
Figure 4A:
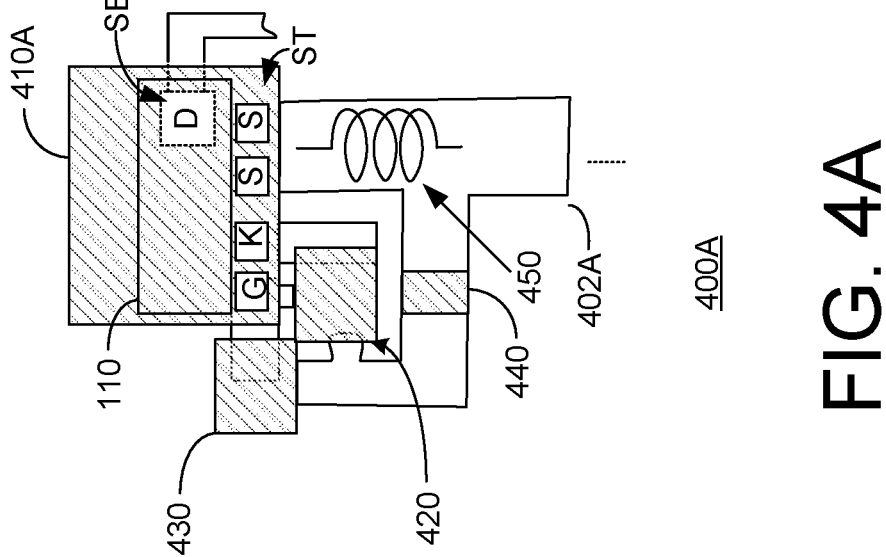
FIG. 4A illustrates a plan view of an example circuit fabricated on a printed circuit board (PCB) with discrete components including a power transistor assembled on the PCB in a Surface Mounted Device (SMD) technology.

FIG. 4A shows a plan view of an example circuit 400A fabricated on a printed circuit board (PCB) 402A. Example circuit 400A may, for example, include a SiC MOSFET SMD package 410A that is surface mounted on PCB 402A. SiC MOSFET SMD package 410A includes a SiC MOSFET device (e.g., SiC MOSFET 110, FIG. 2). SiC MOSFET SMD package 410A may be a four-pin package including a gate pin G, a Kelvin pin K, a source pin S, and a drain pin D. Kelvin pin K may provide a low impedance and low or no current connection to a source of SiC MOSFET 110. Pads for the gate pin G, the Kelvin pin K, the source pins (S, S), are shown on top surface ST of PCB 402A. The low value inductance (e.g., the smaller value inductance of inductor 150A not shown in FIG. 4A) may be a parasitic inductance (e.g., package inductance) associated with Kelvin pin K. The drain of SiC MOSFET 110A may be a metal layer on the back side of SiC MOSFET 110A. In FIG. 4A, the drain contact (D) is schematically shown on the backside surface SB by a square with sides represented by dashed line. In example implementations, a large Lcs may be implemented in circuit 400A by disabling the Kelvin connection or by adding a large discrete inductance at the package and/or the PCB level as described below.

Example circuit 400A may further include a MOSFET SMD package 420 that includes an auxiliary MOSFET device (e.g., auxiliary switch 160, FIG. 2), a gate driver package 430 that includes a gate signal generator (e.g., gate signal 101S), and a resistor 440 (e.g., resistor R1, FIG. 2).

In some example implementations, resistor 440 may be replaced by a diode (e.g., diode 170, FIG. 3).

Example circuit 400A may further include an inductor 450 that has a large value (e.g., >2 nH). Inductor 450 may be the larger of the two asymmetric Lcs (e.g., a smaller value inductance of inductor 150A and a larger value inductance of inductor 150B, FIG. 2) that can be introduced in the circuit to limit turn-off overvoltage in SiC MOSFET 110. In some example implementations, as shown in FIG. 4A, the large Lcs inductor 450 and resistor R1 are implemented at the PCB level. In example implementations, as shown in FIG. 4A, inductor 450 implemented at the PCB level may be a coil of wire.

In some military or industrial applications, the devices in a circuit may be subject to strong impacts and vibrations. For such applications, it may be preferable to use a through-hole mounted (THM) package for the devices. A board assembled with through-hole components can be rugged as a result of the large solder joints that extend throughout the width of the board itself.

FIG. 4B shows a plan view of an example circuit 400B fabricated on a printed circuit board (PCB) 402B using THM technology. Example circuit 400B may, for example, include a SiC MOSFET THM package 410B that is mounted on PCB 402B. SiC MOSFET THM package 410B includes a SiC MOSFET device (e.g., SiC MOSFET 110, FIG. 2). SiC MOSFET THM package 410B may be a four-lead package including a gate lead G1, a Kelvin lead K1, a source lead S1, and a drain lead D1. The Kelvin lead K1 may provide a low impedance and a low current connection to a source of SiC MOSFET 110. In example implementations, a large Lcs may be implemented in circuit 400B by disabling the Kelvin connection or by adding a large inductance at the package and/or the PCB level as described below (and above with reference to circuit 400A, FIG. 4A).

Example circuit 400B, like circuit 400A, FIG. 4A, may further include MOSFET SMD package 420 (that includes auxiliary switch 160, FIG. 2), gate driver package 430 that includes a gate signal generator (e.g., gate signal 101S), and resistor 440 (e.g., resistor R1, FIG. 2). In some example implementations, resistor 440 may be replaced by a diode (e.g., diode 170, FIG. 3).

Example circuit 400B, like circuit 400A, FIG. 4A, may further include an inductor 450 that has a large value (e.g., >2 nH). Inductor 450 may be the larger of the two asymmetric Lcs (e.g., smaller value inductance of inductor 150B and larger value inductance of inductor 150B, FIG. 2) that can be introduced in the circuit to limit turn-off overvoltage in SiC MOSFET 110. In some example implementations, as shown in FIG. 4B, the large Lcs inductor 450 and resistor R1 are implemented at the PCB level. In example implementations, as shown in FIG. 4B, inductor 450 implemented at the PCB level may be a coil of wire.

Operating characteristics of the inductors, capacitors, transistors, and resistors in the examples of FIGS. 1 to 4B can be determined by design and/or process. That is, respective Lcs values and resistance values appropriate for a particular implementation can be achieved through layout and sizing, as well as through selection of semiconductor processing parameters, such as doping concentrations, and or material. While specific examples are shown in, and described with reference to, FIGS. 1 to 4B, in some implementations, other inductors, capacitors, diode and/or resistor implementations can be used. For instance, in some examples, diodes can be implemented as Zener diodes, resistors can be implemented as diffusion resistors or metal resistors, and capacitors can be implemented using low-k and/or high-k dielectrics to achieve a desired capacitance value.

In some example implementations, circuits implementing the asymmetric Lcs scheme (e.g., circuit 400A, FIG. 4A, or circuit 400B, FIG. 4B) may utilize co-integrated devices. For example, circuits implementing the asymmetric Lcs scheme may utilize an auxiliary switch (e.g., auxiliary switch 160, a MOSFET, FIG. 2) that is co-integrated with SiC MOSFET 110. The auxiliary switch (MOSFET) and SiC MOSFET device may be co-integrated in a single semiconductor die fabricated using a common or flexible MOSFET fabrication process.

Figure 5:
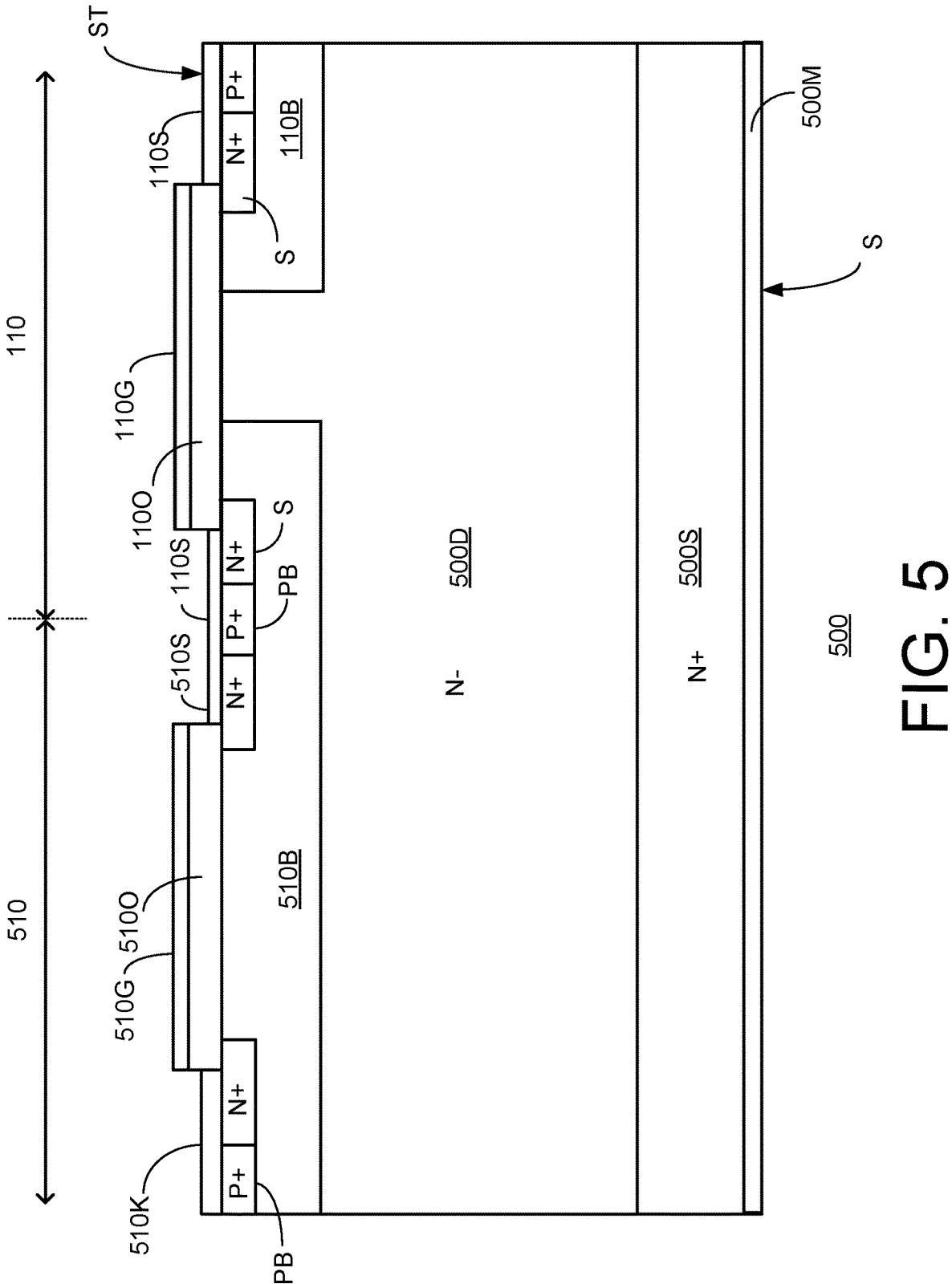
FIG. 5 shows a cross sectional view of a semiconductor die that includes the co-integrated lateral auxiliary MOSFET disposed adjacent to a vertical SiC MOSFET.

In an example implementation, an auxiliary switch (e.g., like auxiliary switch 160, FIG. 2) utilized in circuits implementing the asymmetric Lcs scheme may be a low voltage lateral MOSFET (e.g., lateral MOSFET 510) that is integrated with SiC MOSFET 110 as shown in FIG. 5.

The auxiliary switch (lateral MOSFET 510) and the SiC MOSFET 110 may be co-integrated in a single semiconductor die by a common flexible MOSFET fabrication process. FIG. 5 shows a cross sectional view of a semiconductor die 500 that includes the co-integrated lateral MOSFET 510 disposed adjacent to the SiC MOSFET 110. Lateral MOSFET 510 may occupy a small surface area of semiconductor die 500 compared to the area occupied by the SiC MOSFET 110. The SiC MOSFET 110 may feature a vertical structure with source and drain on opposite sides of the semiconductor die. Current flows vertically in MOSFET 110 between the opposites sides of the semiconductor die. The vertical structure may include an N– epitaxial layer (e.g., layer 500D) disposed on an N+ substrate layer (e.g., layer 500S). Layer 500S may form the drain of the SiC MOSFET 110 disposed adjacent to MOSFET 510. A metal layer (e.g., 500M) disposed a backside of layer 500S may form the drain contact for MOSFET 110. The lateral MOSFET may feature a lateral structure with source and drain at the top side of the semiconductor die. In FIG. 5, the lateral MOSFET 510 has a drain terminal at pad 510K and a source terminal at 510S. The lateral MOSFET 510 is a lateral MOSFET connected from pad 510K to the source of MOSFET 110. In lateral MOSFET 510, the current flows laterally (parallel to the substrate surface) through a channel at a top of region 510B, controlled by the gate 510G.

The Kelvin pad, gate, and source structures of lateral MOSFET 510 and MOSFET 110 can be formed at a top of the N-epitaxial layer (e.g., layer 500D). For example, the sources S of the MOSFETS may be N+ doped regions formed in a P-body region 510B and a P– body region 110B at the top of the N-epitaxial layer (e.g., layer 500D). Source contact pads 510S of lateral MOSFET 510 and source contact pads 110S of MOSFET 110 may be formed by metal layers. The metal layers may be in ohmic contact with the N+ doped regions formed in P– body region 510B and P– body region 110B, respectively. The Kelvin contact pad (e.g., Kelvin contact pad 510K) of lateral MOSFET 510 may be a metal layer in ohmic contact with the N+ doped region formed in P– body region 510B.

In example implementations, the P-body region in MOSFET 510 may be a dedicated P-well as may be needed to adjust a threshold voltage Vth of MOSFET 510.

The gate structure of MOSFET 510 may include a gate 510G (e.g., a metal) disposed on a gate dielectric layer (e.g., dielectric layer 5100) that is disposed on a top surface of semiconductor die 500. The gate structure of MOSFET 110 may include a gate contact pad HOG (e.g., a metal) disposed on a gate dielectric layer (e.g., dielectric layer 1100) that is disposed on the top surface of semiconductor die 500.

In example implementations, P+ doped regions (e.g., region PB) may be used to make an ohmic contact between the P– body regions and source contact pads (e.g., pads 110S and pads 510S), and between the P-body regions and the Kelvin contact pad (e.g., pad 510K) in the co-integrated MOSFET 110 and MOSFET 510.

In some example implementations, circuits (e.g., circuit 400A, FIG. 4A, or circuit 400B, FIG. 4B) implementing the asymmetric Lcs scheme may utilize an auxiliary switch (auxiliary switch 160, FIG. 2)) and a SiC power MOSFET (e.g., SiC MOSFET 110, FIG. 2) that are fabricated on separate semiconductor die. The separate semiconductor die may be individually packaged in different packages (e.g., MOSFET SMD package 420, SiC MOSFET SMD package 410A, SiC MOSFET THM package 410B, FIG. 4A and FIG. 4B).

Figure 6:
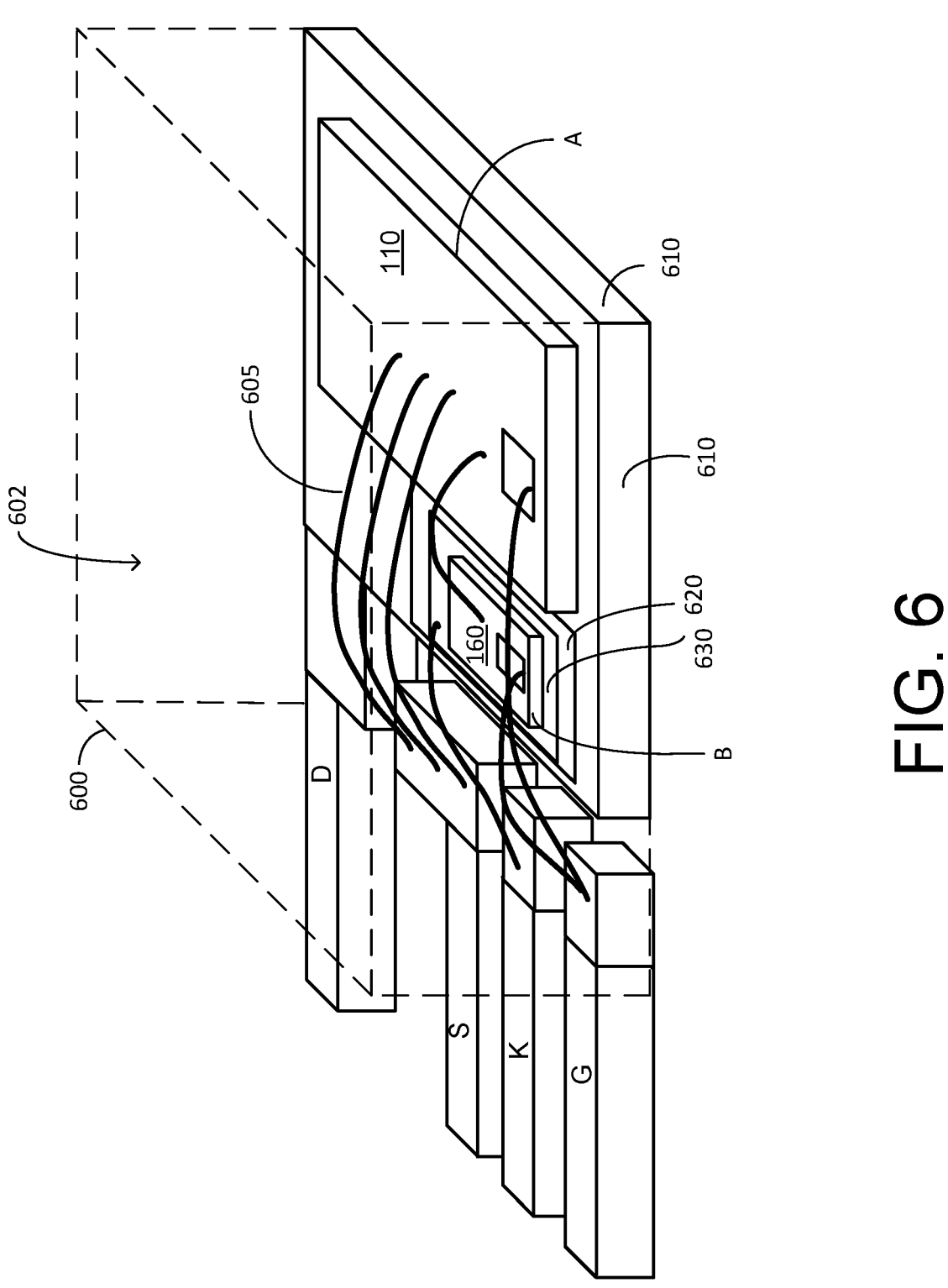
FIG. 6 illustrates a package which includes a SiC MOSFET and an auxiliary switch fabricated on separate semiconductor die (e.g., die A and die B, respectively).

In some implementations, the auxiliary switch and the SiC MOSFET device may be fabricated on separate semiconductor die but co-packaged in a single package. In other words, two semiconductor die may be encapsulated in a single package. FIG. 6 shows, for example, package 600 which includes SiC MOSFET 110 and auxiliary switch 160 that are fabricated on separate semiconductor die (e.g., die A and die B, respectively). In package 600, die A containing SiC MOSFET 110 is disposed on a portion of a leadframe pad 610. Leadframe pad 610 may, for example, be a copper sheet or plate. Die B containing auxiliary switch 160 is disposed on a conductive plate 630 disposed on another portion of leadframe pad 610. An insulating layer 620 may separate conductive plate 630 from leadframe pad 610.

Metal terminals including, for example, drain terminal D, source terminal S, Kelvin terminal K, and gate terminal G may extend externally to the outside of package 600. Drain terminal D may be formed as an extension of leadframe pad 610. Source terminal S, Kelvin terminal K, and gate terminal G may be connected by wire bonds (e.g., wire 605) to respective contact pads (not all shown or labelled in FIG. 6) on auxiliary switch 160 and on SiC MOSFET 110. The wire bonded structures and devices create, for example, a portion of a circuit (e.g., circuit 200, FIG. 2) for implementing an asymmetric common source inductance (Lcs) scheme for turn-on and turn-off of a SiC MOSFET.

In example implementations, the devices, and circuits in package 600 may be encapsulated, for example, in an epoxy mold compound (EMC) 602.

In example implementations, package 600 may be used with a large value Lcs and a resistor R1 implemented at a PCB level as discussed above, for example, with reference to FIG. 4B.

In example implementations, a gate driver circuit for implementing the asymmetric common source inductance (Lcs) scheme for turn-on and turn-off of a SiC MOSFET may utilize a power amplifier that accepts a low-power input from a controller IC and produces a high-current drive input for the gate of the SiC MOSFET. The gate driver can be provided on-chip or as a discrete module.

Figure 7:
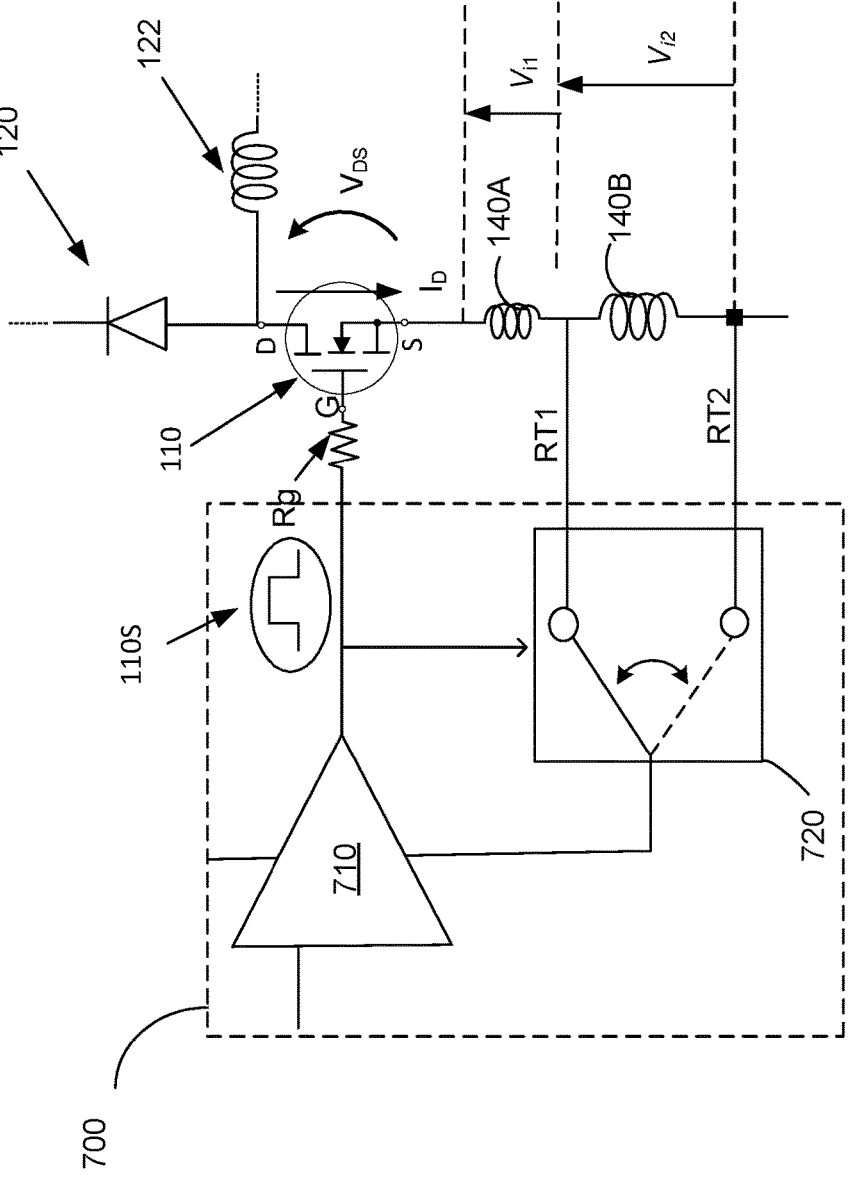
FIG. 7 illustrates a gate driver circuit coupled to the SiC MOSFET of FIG. 1.

FIG. 7 illustrates a gate driver circuit module (e.g., gate driver circuit module 700) coupled to SiC MOSFET 110 (FIG. 1). Gate driver circuit module 700 may serve as the interface between control signals (digital or analog controllers) and the SiC MOSFET. An integrated gate-driver solution reduces design complexity, development time, bill of materials (BOM), and board space while improving reliability over discretely-implemented gate-drive solutions. In the example implementation shown in FIG. 7, gate driver circuit module 700 may include an amplifier 710 (e.g., a power amplifier that accepts a low-power input from a controller IC and produces a high-current drive input for the gate of SiC MOSFET). Further, gate driver circuit module 700 includes internal functionality (e.g., a switching circuitry 720) that switches between a first driver return RT1 and a second driver return RT2. The first driver return RT1 may, for example, introduce a smaller value inductance (e.g., inductor 140A) in the gate-source loop of the SiC MOSFET 110. Second driver return RT2 may introduce a larger value inductance (e.g., inductor 140A in series with inductor 140B) in the gate-source loop of the SiC MOSFET 110. A driver output signal (e.g., signal 101S) driving the gate of SiC MOSFET 110 is also used to drive transistors (not shown) in switching circuitry 720 to select either first driver return RT1, or second driver return RT2 (in other words, select a small value or a large value inductance to match the turn-on/turn-off processes of SIC MOSFET 110).

FIG. 8 shows an example method 800 for reducing turn-off overvoltage and switching power loss (e.g., turn-off power loss, Eoff) in a power MOSFET. The power MOSFET may, for example, be a SiC power MOSFET. The power MOSFET may, for example, be rated for operation at greater than 600V The power MOSFET may include a gate, a source and a drain with the gate controlling a flow of a source-drain current ($I_D$).

Method 800 includes disposing a first inductance and a second inductance next to a main current path shared with a gate driver loop associated with the MOSFET (810). The first inductance may have a smaller inductance value than the second inductance. The main current path (e.g., power path) may be a source-drain current path (e.g., $I_D$ path) shared with the gate driver loop in the MOSFET.

Method 800 further includes switching the gate loop current to flow through the first inductance when the MOSFET is turning on (820); and switching the gate loop current to flow through the second inductance when the MOSFET is turning off (830).

In method 800, disposing the first inductance and the second inductance includes disposing inductances formed of distributed or parasitic inductive elements. The parasitic inductive elements may be a function of packaging and device layout and design. In example implementations, for a 650V SiC MOSFET, the first inductance may have a value less than 0.5 nH, and the second inductance may have a value greater than 3 nH.

In some example implementations, the first and/or the second inductance may include a discrete inductor element. In example implementations, the discrete inductor element can be a cylindrical wire coil.

As discussed above, the circuit arrangements (e.g., circuit 200, FIG. 2) implementing the asymmetric common source inductance (Lcs) scheme for turn-on and turn-off of a SiC MOSFET as discussed above may involve circuits constructed from discrete components, or from circuits and devices co-integrated on a single die, or circuits and devices fabricated on individual dies that are co-packaged. In all such circuits, a common principle of operation is the use of a first driver return path to counteract the applied gate-source voltage with a voltage $V_{i1}$ (e.g., induced voltage $V_{i1}$=Lcs(inductance 150A, FIG. 2)*$dI_D$/dt) on a small value inductance when turning on the SiC MOSFET, and the use a second driver return path to counteract the applied gate-source voltage with a voltage $V_{i2}$ (e.g., induced voltage $V_{i2}$=Lcs(inductance 150A+inductance 150B, FIG. 2)*$dI_D$/dt) on a large value inductance when turning-off the SiC MOSFET.

Figure 9A:
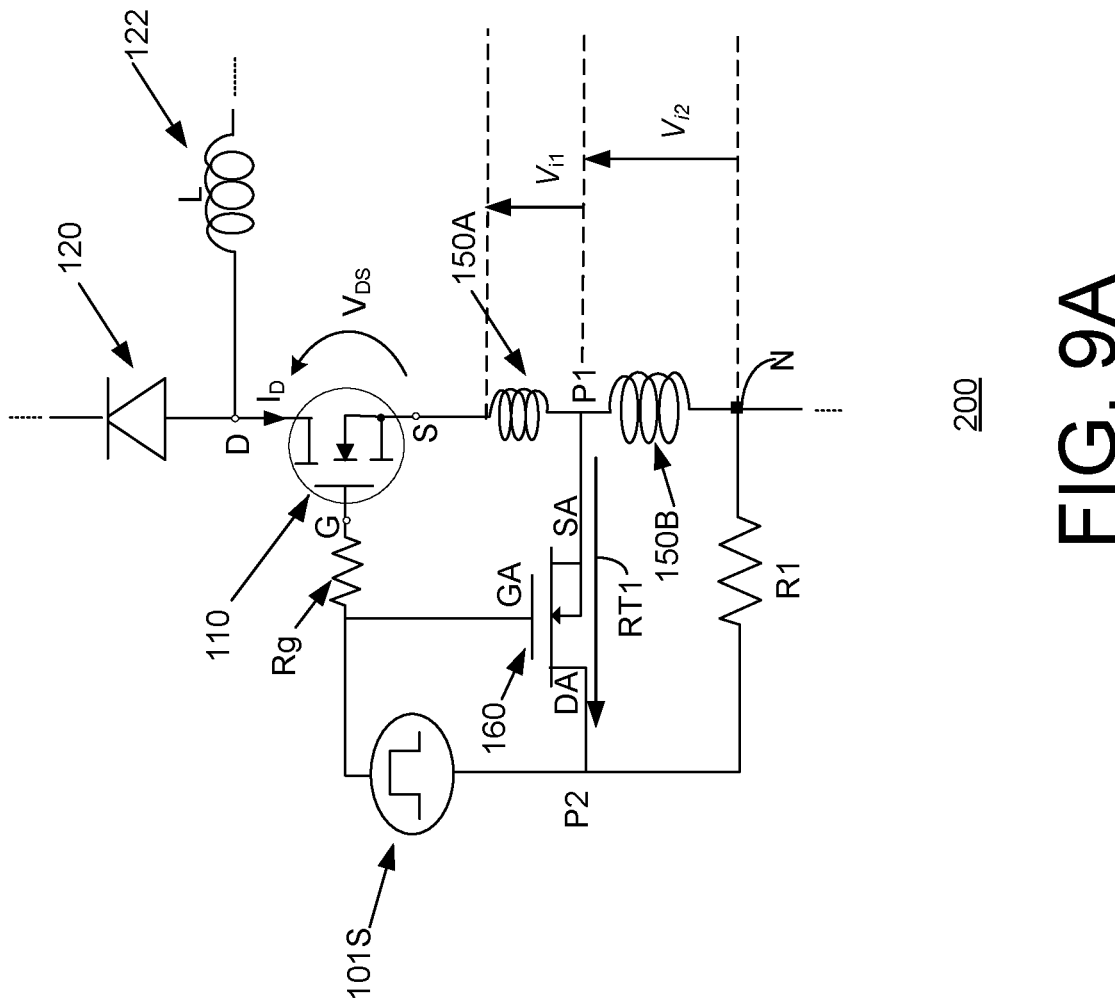
FIG. 9A illustrates a gate driver circuit for a SiC MOSFET with a first driver return path.

In circuit 200, as shown in FIG. 9A, a first driver return path RT1 allows only the current through a small value inductance, e.g., inductor 150A. The first driver return path RT1 is created between tap point P1 and P2 by activating auxiliary switch 160 when turning on the SiC MOSFET (e.g., MOSFET 110). R1 is greater than the on resistance of auxiliary switch 160. When the SiC MOSFET is turned-on, the auxiliary switch 160 is turned-on faster due to smaller parasitic input capacitances and a lower threshold voltage; Lcs remains low.

The common source inductances (Lcs) (e.g., small value or large value Lcs) in the power current path are used as feedback elements to generate a gate driver current.

In a first quadrant mode of MOSFET operation, a n-channel MOSFET operation begins when a positive voltage is applied to the drain. In circuit 200, an induced voltage Vi at tap point P1 (induced by current flow through the larger inductor 150B) may be given by $V_i=L*di/dt$. The drain-to source voltage $v_{DS\_AUX}$ in auxiliary switch 160 is approximately equal to $-V_i$ in auxiliary switch 160 during the drain current ($I_D$) ramp-up to a third quadrant mode of MOSFET operation. In the third quadrant mode, current flows in the reverse direction compared to first-quadrant operation.

Figure 9B:
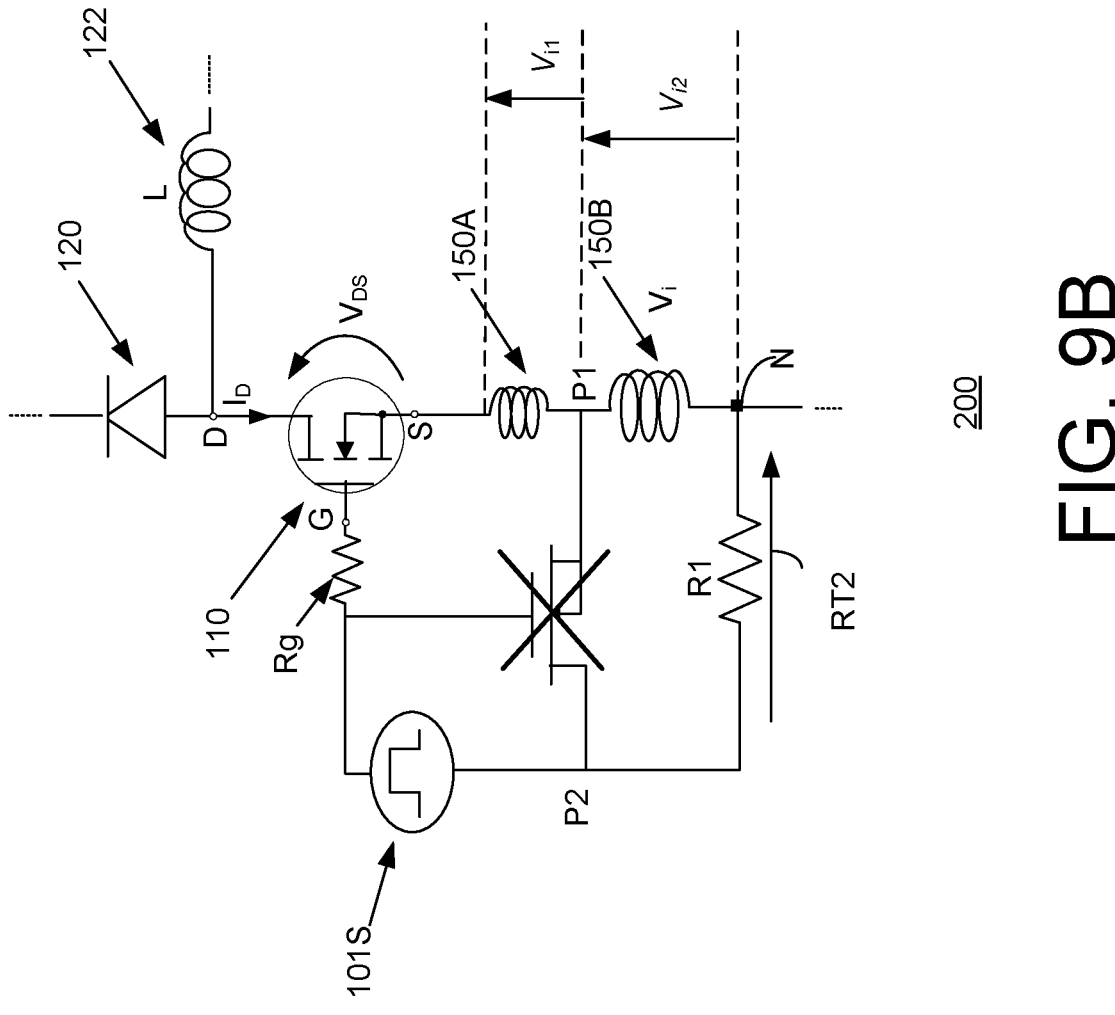
FIG. 9B a gate driver circuit for the SiC MOSFET of FIG. 9A with a second driver return path.

In circuit 200, as shown in FIG. 9B, a second driver return path RT2 sends the source-drain current through the large value inductance, e.g., inductor 150B (and the small value inductor 150A in series). An induced voltage Vi at tap point P1 (induced by current flow through the larger inductor 150B) may be given by a negative of $V_i=L*di/dt$. The drain-to source voltage $v_{DS\_AUX}$ in auxiliary switch 160 is approximately equal to $-V_i$ during the drain current ($I_D$) ramp down to the first quadrant mode of MOSFET operation. However, there is no conduction through auxiliary switch 160 at the negative $v_{DS\_AUX}$. Auxiliary switch 160 is effectively discontinuous in circuit 200. The discontinuity is pictorially depicted by the X mark placed on auxiliary switch 160 in FIG. 9B.

An induced voltage Vi at tap point P1 (induced by current flow through the larger inductor 150B) may be given by a negative of $V_i=Lcs*dI_D/dt$. The drain-to-source voltage $v_{DS\_AUX}$ in auxiliary switch 160 is approximately equal to $-V_i$ during the drain current ($I_D$) ramp down to the first quadrant mode of MOSFET operation. However, there is no conduction through auxiliary switch 160 at the negative $v_{DS\_AUX}$. Auxiliary switch 160 is effectively discontinuous in circuit 200. The discontinuity is pictorially depicted by the X mark placed on auxiliary switch 160 in FIG. 9B.

The second driver return path RT2 in circuit 200 is created between tap point P2 and node N by deactivating auxiliary switch 160 when turning off the SiC MOSFET (e.g., MOSFET 110). When the SiC MOSFET is turned-off, the auxiliary switch 160 is turned-off faster, the kelvin pin (FIG. 4A to FIG. 6) in SiC MOSFET is disconnected, and the driver return (RT2) remains connected to a point (e.g., node N) with a larger Lcs.

Figure 9C:
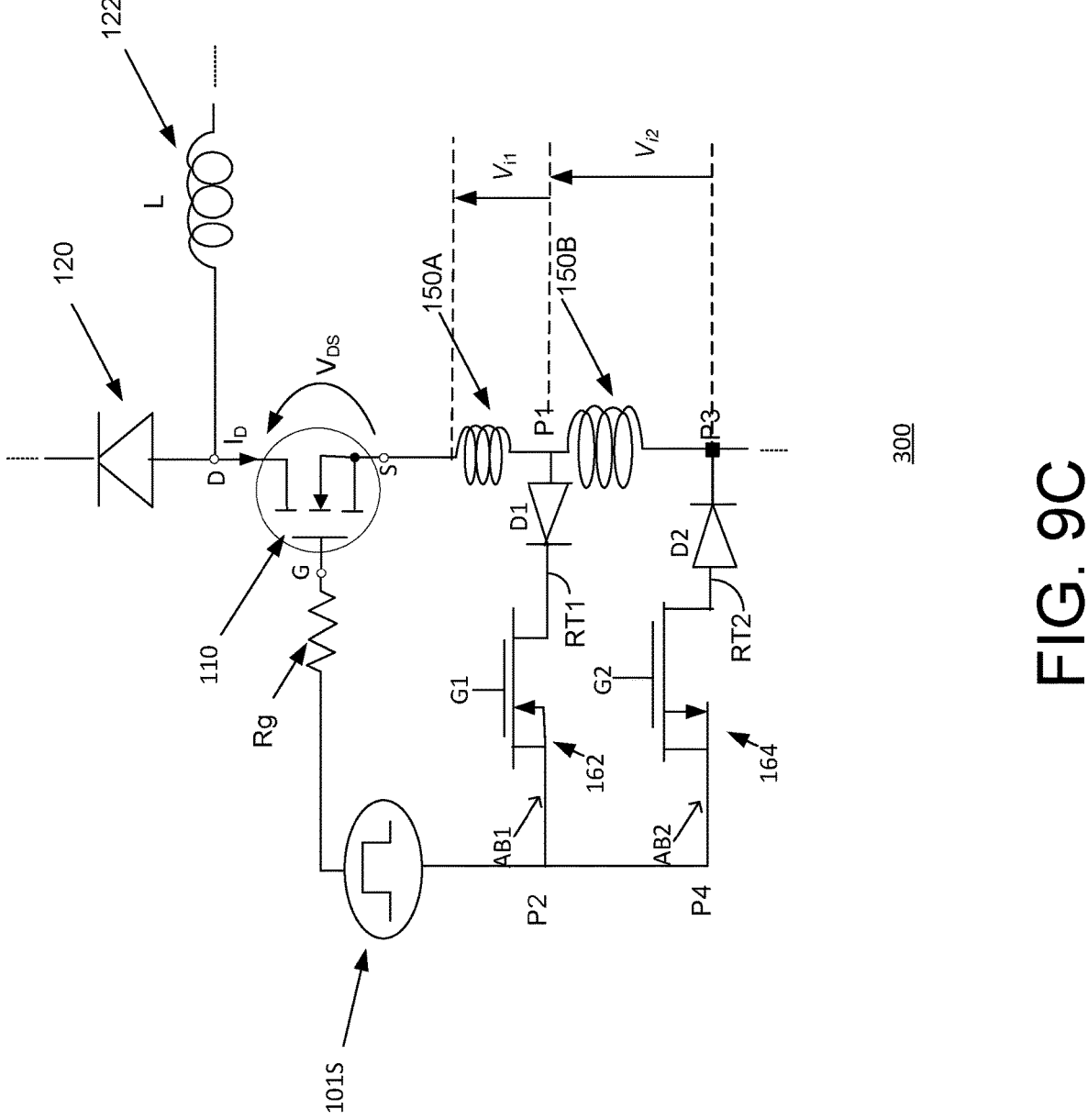
FIG. 9C illustrates a gate driver circuit for the SiC MOSFET of FIG. 3 with a first auxiliary branch for a first driver return path and a second auxiliary branch for a second driver return path.

In another example implementation, in circuit 300, as shown in FIG. 9C, for implementing the asymmetric Lgs scheme, a first driver return path RT1 includes the small value inductance, e.g., inductor 150A, as the common inductance between the gate and power loops. A second driver return path RT2 includes the large value inductance, e.g., inductor 150B, as the common inductance between the gate and power loops. In FIG. 9C, the return paths for implementing the asymmetric Lgs scheme are implemented by two auxiliary branches (e.g., auxiliary branch AB1 and auxiliary branch AB2) in the driver circuitry. As shown in FIG. 9C, auxiliary branch AB1 extends between tap point P1 and tap point P2, and auxiliary branch AB2 extends between tap point P3 and tap point P4. Each auxiliary branch includes a low voltage transistor (auxiliary switch) and a diode. For example, auxiliary branch AB1 includes diode D1 and MOSFET 162 with a gate G1 and; and auxiliary branch AB2 includes diode D2 and MOSFET 164 with a gate G2.

This circuit solution based on having two auxiliary branches with a transistor and a diode in each branch is a safer method for avoiding current recirculation in the loop of large inductance. However, this solution requires a circuitry (not shown) to drive the transistor gates G1 and G2.

The electrical properties and the behavior of circuits (such as circuit 200, FIG. 2, or circuit 300, FIG. 9A to FIG. 9C) implementing the asymmetric small/large Lcs scheme for a SiC MOSFET can be analyzed using Technology Computer Aided Design (TCAD) tools of the semiconductor industry. The TCAD tools can be used to simulate and analyze the semiconductor device and circuit elements behaviors at a device level, at a die level or a package level.

In an example TCAD simulation analysis, circuit 200 includes SiC MOSFET 110 fabricated on a semiconductor die. Auxiliary switch 160 may be represented by a known process model of a commercially available 60V MOSFET device (e.g., NTMFS4C032N T6 MOSFET available from onsemi). The semiconductor die including SiC MOSFET 110 is placed on a lead frame and encapsulated in a package (e.g., package 600, FIG. 6). The package may have leads or terminals for external connections to the gate, source, drain and Kelvin pad of SiC MOSFET 110 fabricated on the semiconductor die. For the analysis, gate-to-source voltages can be measured at the die level (e.g., $V_{GS\_DIE}$), at the package level (e.g., $V_{GS\_PCKG}$), and at auxiliary switch 160 (e.g., $V_{GS\_AUX}$). Drain-to-source voltages are measured at the die level (e.g., $V_{DS\_DIE}$), at the package level (e.g., $V_{DS\_PCKG}$), and at auxiliary switch 160 level (e.g., $V_{DS\_AUX}$).

Figure 10A:
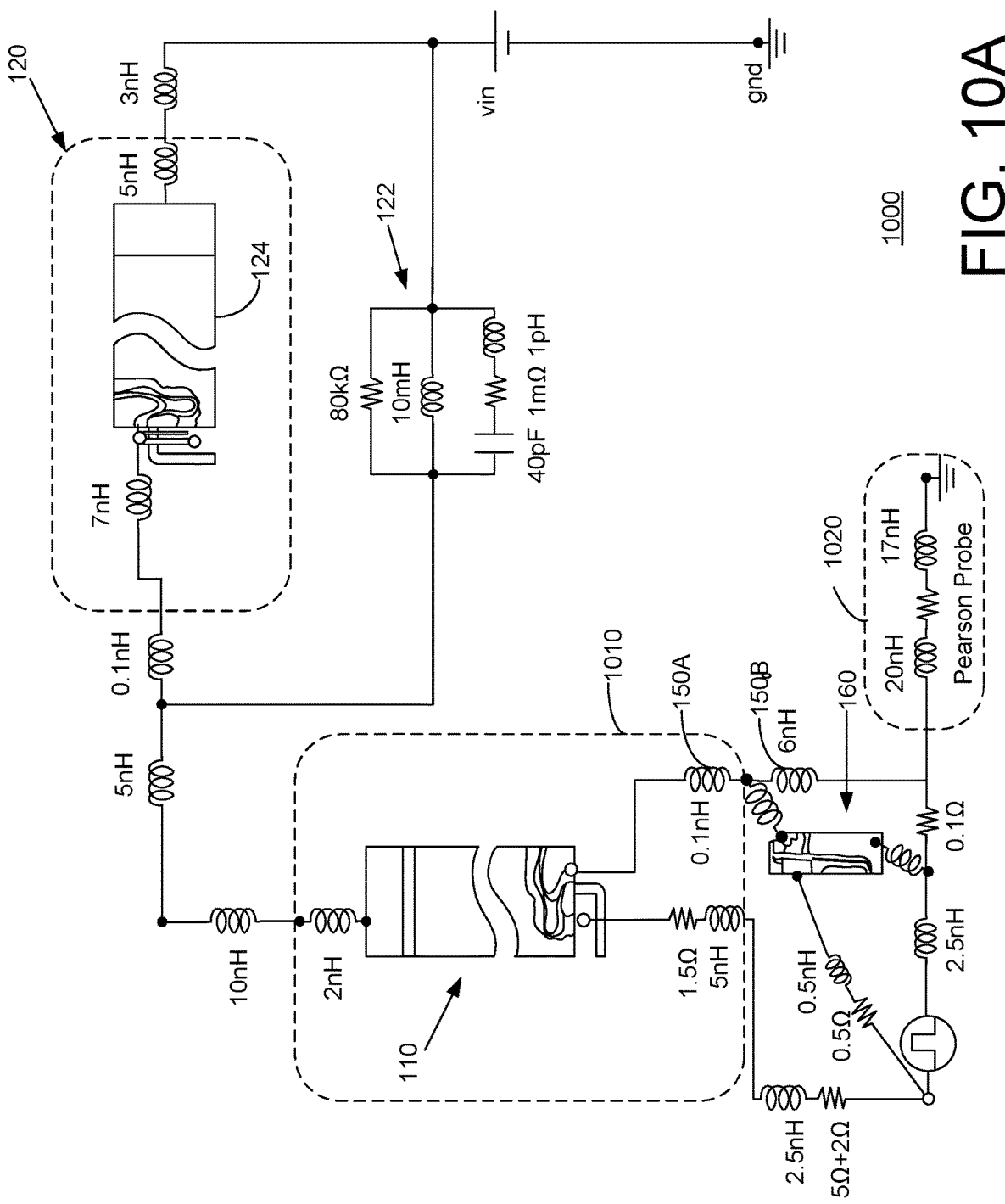
FIG. 10A schematically illustrates a mixed mode simulation model (TCAD-SPICE model) of a package including the circuit shown in FIG. 2 within a double pulse test circuit.

FIG. 10A shows an example model simulation circuit 1000 that can be used to analyze the behavior of the circuits described herein (e.g., circuit 200, FIG. 2). The behavior of simulation circuit 1000 may be analyzed using TCAD and SPICE models.

Model simulation circuit 1000 includes a semiconductor die package 1010 including SiC MOSFET 110 coupled to an auxiliary switch (e.g., auxiliary switch 160, a MOSFET). An output load of semiconductor die package 1010 is represented by a diode 120 and an RLC circuit including inductance (L) 122. Diode 120 may be formed by a MOSFET 124 having its gate and source shorted. In FIG. 10A, the various MOSFETS (e.g., MOSFET 110, auxiliary switch 160 (MOSFET), and MOSFET 124) are represented by 2-dimensional TCAD cross-sectional views. In example implementations the MOSFETS 110 and 124 can be 650 volt/50 MΩ SiC MOSFETs. The auxiliary switch 160 (MOSFET) may, for example, be a single 30V n-channel power MOSFET (e.g., a NTMFS4C032N T6 MOSFET).

In example implementations, the electrical circuit components, and connections between the various components in the simulation model can include inductors, resistors, and capacitor elements. These elements may include discrete (lumped) elements and or can be formed by distributed or parasitic elements. In the implementation the shown in FIG. 10A, a plurality of inductors, resistors, and capacitor elements are shown with example assigned values. The assigned values may be computed or heuristic values. In example implementations, model simulation circuit 1000 may include or be coupled to a Pearson Current Probe 1020. The Pearson Current Probe 1020 may be configured to measure on/off cycles, ripple wave forms and switching loss, etc.

Figure 10B:
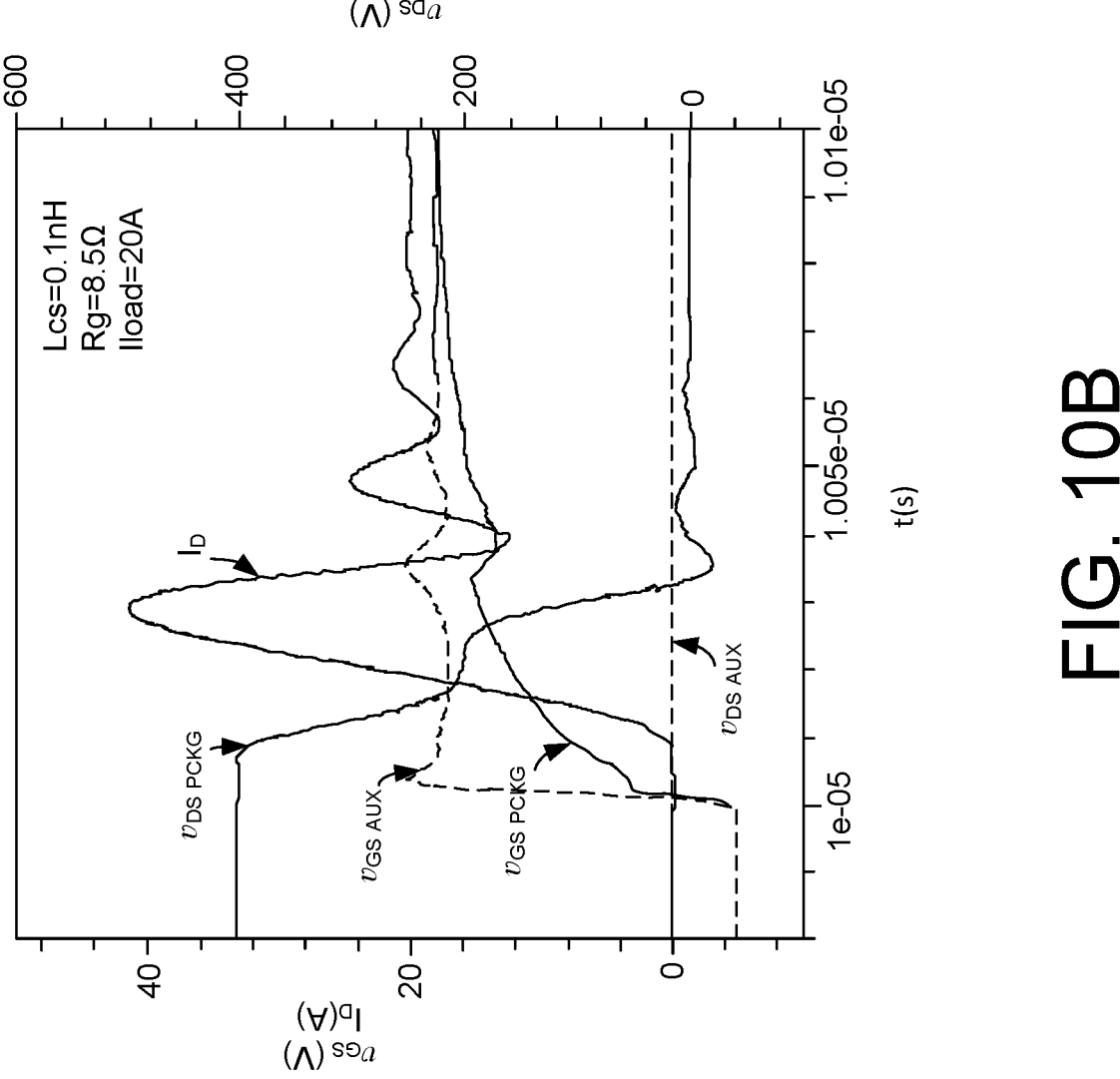
FIG. 10B illustrates a graph of source-drain current, gate-to-source voltages, and drain-to-source voltages during MOSFET turn-on (corresponding to a state of the circuit shown in FIG. 2).

FIG. 10B shows the simulated values for the source-drain current $I_D$ during MOSFET turn-on (corresponding to the state of the circuit shown in FIG. 9A) as a function of time. FIG. 10A also shows the gate-to-source voltages at the package level (e.g., $V_{GS\ PCKG}$), and at the auxiliary switch (e.g., $V_{GS\ AUX}$); and the drain-to-source voltages at the package level (e.g., $V_{DS\ PCKG}$), and at the auxiliary switch level (e.g., $V_{DS\ AUX}$).

Figure 10C:
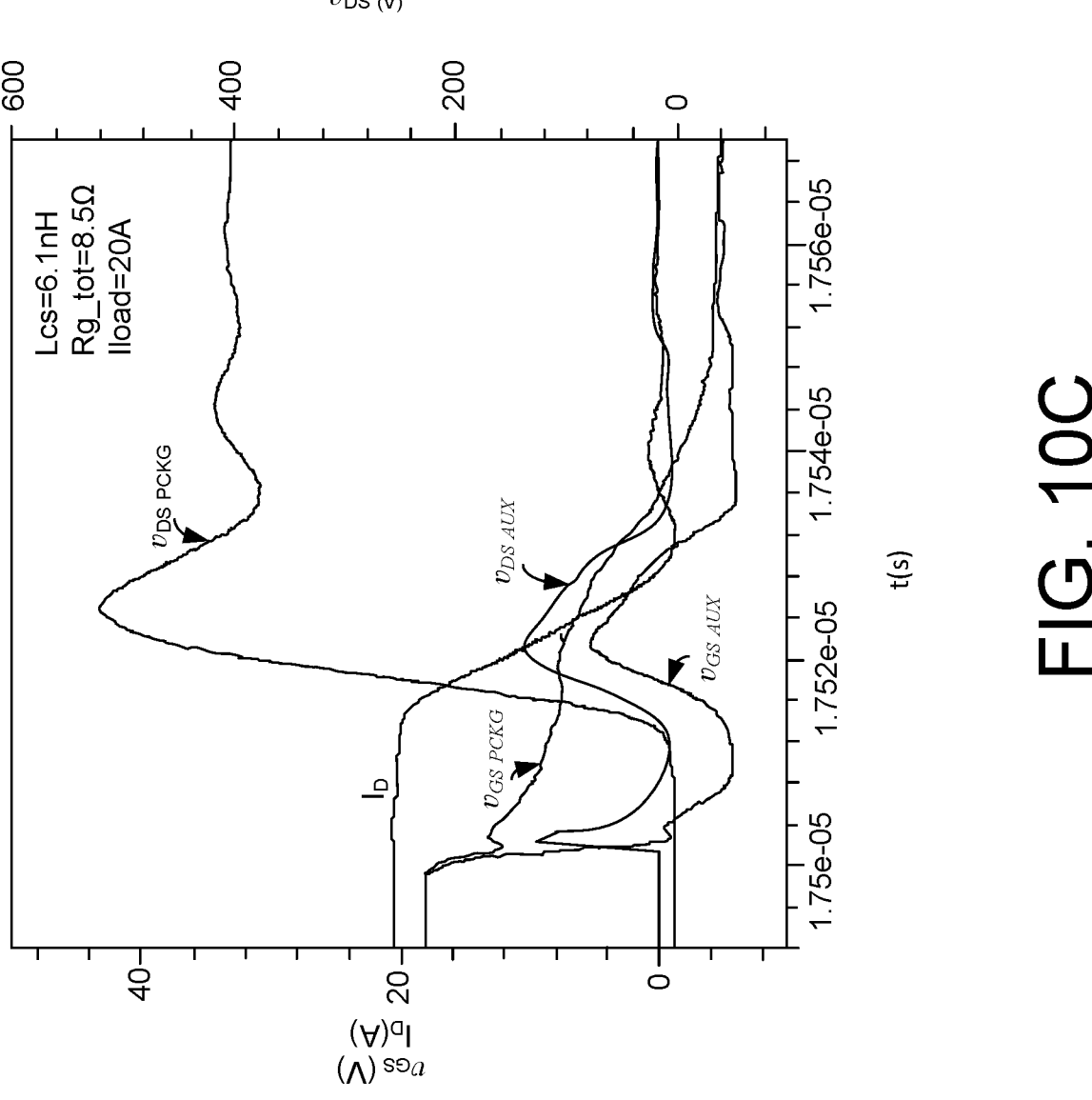
FIG. 10C illustrates a graph of source-drain current, gate-to-source voltages, and drain-to-source voltages during MOSFET turn-off (corresponding to the state of the circuit shown in FIG. 2).

FIG. 10C shows the simulated values for the source-drain current $I_D$ during MOSFET turn-off (corresponding to the state of the circuit shown in FIG. 9B) as a function of time. FIG. 10C also shows the gate-to-source voltages at the package level (e.g., $V_{GS\ PCKG}$), and at the auxiliary switch (e.g., $V_{GS\ AUX}$); and the drain-to-source voltages at the package level (e.g., $V_{DS\ PCKG}$), and at auxiliary switch level (e.g., $V_{DS\ AUX}$).

As previously noted, the asymmetric Lcs scheme as implemented, for example, in circuit 200 or circuit 300 substantially reduces switching losses (Esw) for the same Vds max compared to a circuit solution with only asymmetric Rg. The benefits of the asymmetric Lcs scheme may be additive to schemes based on using asymmetric Rg.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. As used herein, coupled to, or coupled with can refer to being electrically coupled to, electrically coupled with, physically coupled to, and/or physically coupled with.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A circuit comprising:
 a metal-oxide semiconductor field-effect transistor (MOSFET) including a gate, a source, and a drain, the gate being controlled by a gate drive signal;
 a first inductor, a second inductor, and a current-limiting element disposed in series in a source-drain current path and shared with a gate driver loop of the MOSFET; and
 a switch configured to close such that a gate loop current flows through the first inductor and bypasses the second inductor and the current-limiting element when the MOSFET is turning on, the switch being controlled by the gate drive signal.

2. The circuit of claim 1, wherein the MOSFET is a high voltage SiC power MOSFET and the switch is a low voltage MOSFET disposed in parallel to the second inductor and the current-limiting element.

3. The circuit of claim 1, wherein the switch is configured to open when the MOSFET is turning off to introduce the second inductor in the source-drain current path.

4. The circuit of claim 1, wherein the current-limiting element is a resistor.

5. The circuit of claim 1, wherein the current-limiting element is a diode.

6. The circuit of claim 1, wherein the MOSFET and at least the first inductor are encapsulated in a first package, the switch is encapsulated in a second package, and the circuit is assembled on a printed circuit board (PCB) with the first package and the second package mounted on the PCB.

7. The circuit of claim 6, wherein the second inductor is implemented by disabling a Kelvin connection to the MOSFET.

8. The circuit of claim 6, wherein the second inductor is implemented by adding an inductance at least one of at a package or a PCB level.

9. The circuit of claim 1, wherein the MOSFET and the switch are co-integrated in a single semiconductor die.

10. The circuit of claim 1, wherein the MOSFET and the switch are fabricated on two separate semiconductor die that are co-packaged in one package.

11. The circuit of claim 1, further comprising:
 a gate driver circuit module coupled to the MOSFET, the gate driver circuit module including an amplifier producing a high-current drive input for the gate of the MOSFET; and
 a switching circuitry that switches between a first driver return and a second driver return, the first driver return introducing a smaller value inductor in the source-drain current path of the MOSFET, the second driver return introducing a larger value inductor in the source-drain current path of the MOSFET, the switching circuitry controlled by an output signal of the amplifier.

12. A method comprising:

disposing a first inductor, a second inductor, a current-limiting element in series in a source-drain current path shared with a gate driver loop associated of a MOS-FET;

disposing a switch configured to close such that a gate loop current flows through the first inductor and bypasses the second inductor and the current-limiting element, the switch being controlled by a gate drive signal for the MOSFET; and switching a gate loop current to flow through the first inductor and bypass the second inductor when the MOSFET is turning on.

13. The method of claim 12, wherein the MOSFET is a silicon carbide (SiC) power MOSFET.

14. The method of claim 13, wherein the first inductor has an inductance value smaller than 0.5 nH and the second inductor has an inductance value greater than 3.0 nH.

15. The method of claim 12, wherein disposing the first inductor and the second inductor includes disposing inductors formed of distributed or parasitic inductive elements.

16. The method of claim 12, wherein disposing the first inductor and the second inductor includes disposing a discrete inductor element.

17. The method of claim 16, wherein disposing the discrete inductor element includes disposing a cylindrical wire coil.

\* \* \* \* \*